United States Patent
Chung et al.

(10) Patent No.: US 11,307,263 B2
(45) Date of Patent: Apr. 19, 2022

(54) DEVICE AND METHOD FOR PREDICTING STATE-OF-HEALTH OF BATTERY

(71) Applicant: LG CHEM, LTD., Seoul (KR)

(72) Inventors: Dae Sik Chung, Daejeon (KR); Jee Ho Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 16/956,832

(22) PCT Filed: Mar. 7, 2019

(86) PCT No.: PCT/KR2019/002681
§ 371 (c)(1),
(2) Date: Jun. 22, 2020

(87) PCT Pub. No.: WO2019/172692
PCT Pub. Date: Sep. 12, 2019

(65) Prior Publication Data
US 2020/0408848 A1    Dec. 31, 2020

(30) Foreign Application Priority Data

Mar. 7, 2018  (KR) .................. 10-2018-0027052
Mar. 6, 2019  (KR) .................. 10-2019-0025819

(51) Int. Cl.
*G01R 31/392*   (2019.01)
*G01R 31/3835*  (2019.01)
*G01R 31/367*   (2019.01)

(52) U.S. Cl.
CPC ......... *G01R 31/392* (2019.01); *G01R 31/367* (2019.01); *G01R 31/3835* (2019.01)

(58) Field of Classification Search
None
See application file for complete search history.

(56) References Cited

U.S. PATENT DOCUMENTS

2005/0110466 A1   5/2005   Shoji
2011/0060538 A1   3/2011   Fahimi et al.
(Continued)

FOREIGN PATENT DOCUMENTS

CN   102520367 A   6/2012
CN   103197257 A   7/2013
(Continued)

OTHER PUBLICATIONS

European Search Report for European Palent Application No. 19763572.5 dated Nov. 20, 2020.
(Continued)

*Primary Examiner* — Jas A Sanghera
(74) *Attorney, Agent, or Firm* — Birch, Stewart, Kolasch & Birch, LLP (57) ABSTRACT

An ESS SOH prediction method includes: a capacity virtual division step of virtually dividing a capacity of a measurement target ESS that is to predict an SOH into two or more capacity ranges; each capacity range-dependent charging/discharging cycle data measurement step of measuring charging/discharging cycle data of each capacity range divided in the capacity virtual division step; and a measurement target ESS SOH prediction step of predicting an SOH of a measurement target ESS based on charging/discharging cycle data of each actual ESS measured in the each capacity range-dependent charging/discharging cycle data measurement step.

15 Claims, 5 Drawing Sheets

(56) References Cited

U.S. PATENT DOCUMENTS

| | | |
|---|---|---|
| 2013/0241567 A1 | 9/2013 | Boehm et al. |
| 2013/0346001 A1 | 12/2013 | Park et al. |
| 2014/0145853 A1* | 5/2014 | Chang ............... G01R 31/3835 |
| | | 340/636.15 |
| 2014/0184233 A1 | 7/2014 | Nam |
| 2016/0297318 A1 | 10/2016 | Kirimoto |
| 2017/0108553 A1 | 4/2017 | Ganesan et al. |
| 2020/0057113 A1 | 2/2020 | Ukumori |

FOREIGN PATENT DOCUMENTS

| | | |
|---|---|---|
| CN | 103344917 A | 10/2013 |
| CN | 107024664 A | 8/2017 |
| CN | 107045103 A | 8/2017 |
| CN | 107271913 A | 10/2017 |
| CN | 107728072 A | 2/2018 |
| CN | 107768708 A | 3/2018 |
| CN | 112834944 A | 5/2021 |
| EP | 2 963 433 A1 | 1/2016 |
| JP | 2001-74821 A | 3/2001 |
| JP | 2005-73498 A | 3/2005 |
| JP | 3878397 B2 | 2/2007 |
| JP | 2015-99042 A | 5/2015 |
| JP | 2017-116522 A | 6/2017 |
| JP | 6224130 B2 | 11/2017 |
| JP | 6238314 B2 | 11/2017 |
| JP | 2018-169394 A | 11/2018 |
| KR | 10-2013-0089360 A | 8/2013 |
| KR | 10-1338348 B1 | 12/2013 |
| KR | 10-2014-0084823 A | 7/2014 |
| KR | 10-2017-0045140 A | 4/2017 |
| KR | 10-2018-0005345 A | 1/2018 |
| WO | WO 2015/002334 A1 | 1/2015 |

OTHER PUBLICATIONS

International Search Report issued in PCT/KR2019/002681 (PCT/ISA/210), dated Jun. 18, 2019.

"Multi-time scale state estimation of lithium—ion batteries using Data driven method". Chinese Doctoral dissertation Full-text of Beijing Jiaotong University in China, published on Dec. 15, 2017.

"Research on the variation characteristics of capacity and internal resistance of Lithium-ion batteries echelon use", Chinese Master's Theses Full-text of Beijing Jiaotong University in China, published on Jun. 15, 2014.

Xiaoli Qin et al., "Prognostics of remaining useful life for lithium-ion batteries based on a feature vector selection and relevance vector machine approach", 2017 IEEE International Conference on Prognostics and Health Management (ICPHM).

Xue Nan, "Different state of Charge Range Cycle Degradation Mechanism of Composite Material Lithium-Ion Batteries Based on incremental Capacity Analysis", Transactions of China Electrotechnical 4 Society vol. 32, No. 13, published on Jul. 2017, pp. 145-152.

* cited by examiner

DEVICE AND METHOD FOR PREDICTING STATE-OF-HEALTH OF BATTERY

TECHNICAL FIELD

The present invention relates to a device and a method for rapidly predicting the SOH of a battery.

More particularly, the present invention relates to a device and method for rapidly predicting the SOH of a battery by predicting the SOH of the battery by dividing it by sections.

BACKGROUND ART

As the use of portable electrical appliances such as notebooks, video cameras is activated, the importance of the secondary battery, which is mainly used as a driving power source, is increasing.

In addition, there is a growing need for an energy storage system (ESS) for supplying a large capacity of power by connecting secondary batteries in series and in parallel.

On the other hand, the importance of the technology related to the management system for more efficiently using and managing the ESS is increasing. Especially, in order to properly adjust the charging or discharging output and the State of Charge (SOC) usage strategy of the ESS, the management system must be able to accurately predict the State of Health (SOH) of the ESS.

Generally, in order to predict the SOH in the ESS, ESS charging/discharging experiment data of about 4000 cycles or more were required. Conventionally, SOH experiments were performed while charging/discharging the entire battery capacity under actual use conditions. In this experiment, since only data of an average of 4 to 5 cycles are obtained per day, approximately 900 days were required to obtain about 4000 charging/discharging test data.

Since the above-described conventional method obtains experimental data for predicting the SOH of the ESS over 30 months, it takes a long time to develop ESS, so that it was difficult to produce desired ESS in the market.

To solve this problem, there was a method of predicting the SOH using extrapolation, but there is a problem that the reliability is worse due to a large error as compared with the actual SOH of the ESS.

Therefore, the present invention proposes a device and method for maintaining the reliability of SOH prediction while reducing the time required to predict the SOH of the ESS.

(Prior art document) Korean Patent Application Publication No. 10-2013-0089360

DISCLOSURE OF THE INVENTION

Technical Problem

The present invention attempts to solve the problem that it takes a long time to obtain data for predicting the SOH of the ESS of the prior art, and the SOH prediction of the ESS takes a long time.

More specifically, the present invention provides a device and method for predicting the SOH of an ESS by dividing the capacity of the ESS into a plurality of capacity ranges to obtain charging/discharging cycle data of the ESS.

Technical Solution

According to an embodiment of the present invention, an energy storage system (ESS) state of health (SOH) predic-tion method includes: a capacity virtual division step of virtually dividing a capacity of a measurement target ESS into two or more; each capacity range-dependent charging/discharging cycle data measurement step of measuring charging/discharging cycle data of each capacity range divided in the capacity virtual division step; and a measurement target ESS SOH prediction step of predicting an SOH of the measurement target ESS based on charging/discharging cycle data of each actual ESS measured in the each capacity range-dependent charging/discharging cycle data measurement step.

The capacity virtual division step may include: a division range number setting step of setting a number of ranges a total capacity of the measurement target ESS is divided; and an actual ESS preparation step of preparing an actual ESS for each capacity range of the measurement target ESS, wherein a range of the actual ESS may be set based on an output voltage to match the divided range, wherein the divided range of the actual ESS may be overlapped with ranges adjacent to each other by a predetermined range.

The each capacity range-dependent charging/discharging cycle data measurement step may repeat the charging/discharging of the actual ESS corresponding to each capacity range divided in the capacity virtual division step to measure charging/discharging cycle data of the actual ESS corresponding to the each capacity range.

The method of the repeating charging/discharging of the actual ESS may include: a first reference voltage setting step of setting a first reference voltage matching an upper limit capacity in each capacity range corresponding to the actual ESS; a second reference voltage setting step of setting a second reference voltage matching a lower limit capacity in each capacity range corresponding to the actual ESS; an output voltage measurement step of measuring an output voltage of the actual ESS; a comparison step of comparing the measured output voltage of the actual ESS with the first and second reference voltages; and a charging/discharging determination step of determining charging or discharging of the actual ESS according to a comparison result of the comparison step.

The charging/discharging determination step may include performing charging when the output voltage of the actual ESS is less than or equal to the first reference voltage according to the comparison result of the comparison step and stopping charging and performing discharging when the output voltage of the actual ESS exceeds the first reference voltage.

The charging/discharging determination step may include performing discharging when the output voltage of the actual ESS is greater than or equal to the second reference voltage according to the comparison result of the comparison step and stopping discharging and performing charging when the output voltage of the actual ESS is less than the second reference voltage.

The ESS SOH prediction step may predict an SOH of an ESS through at least one of: a first method for predicting the SOH of the ESS by summing each capacity range-dependent charging/discharging cycle data measured in the each capacity range-dependent charging/discharging cycle data measurement step; a second method for predicting the ESS SOH by a combination sum of each capacity range-dependent charging/discharging cycle data measured in the each capacity range-dependent charging/discharging cycle data measurement step; and a third method for predicting the ESS SOH using a multiplicative probability of each capacity range-dependent charging/discharging cycle data measured in the each capacity range-dependent charging/discharging cycle data measurement step.

According to a first embodiment of the present invention, an energy storage system (ESS) state of health (SOH) prediction device includes: a plurality of actual energy storage systems (ESSs); and an analysis unit for measuring and analyzing charging/discharging cycle data from each of the plurality of actual ESSs, wherein the analysis unit includes: a virtual capacity division unit for virtually dividing a capacity of the ESS to be measured into two or more capacity ranges; a reference voltage setting unit for setting a first reference voltage and a second reference voltage matching the divided capacitance range; and an ESS SOH prediction unit for predicting the SOH of the ESS from the inputted charging/discharging cycle data, wherein the number of actual ESSs is equal to or greater than the number of capacity ranges divided by the virtual capacity division unit, wherein the analysis unit transmits a first reference voltage and a second reference voltage matching the divided capacity range to the plurality of actual ESSs and repeats the charging or discharging process of each actual ESS to measure divided capacity range-dependent charging/discharging cycle data.

The virtual capacity division unit may set the virtually divided capacity range to overlap ranges adjacent to each other by a predetermined range, wherein the first reference voltage may correspond to an upper limit capacity of each divided capacity range, wherein the second reference voltage may corresponds to a lower limit capacity of each divided capacity range, wherein the first reference voltage may be higher than the second reference voltage.

Each of the plurality of actual ESSs may include a BSC for controlling charging/discharging of an actual ESS, wherein when the initial output voltage of the actual ESS is less than or equal to the first reference voltage, after charging is performed until the output voltage of the actual ESS becomes the first reference voltage, when the output voltage of the actual ESS exceeds the first reference voltage, the BSC may stop charging and perform discharging, wherein when the initial output voltage of the actual ESS is greater than or equal to the second reference voltage, after discharging is performed until the output voltage of the actual ESS becomes the second reference voltage, and when the output voltage of the actual ESS becomes less than the second reference voltage, the BSC may stop discharging and perform charging.

The ESS SOH prediction unit may predict an SOH of an ESS through at least one of: a first method for predicting the SOH of the ESS by summing each capacity range-dependent charging/discharging cycle data measured in each of the plurality of actual ESSs; a second method for predicting the ESS SOH by a combination sum of each capacity range-dependent charging/discharging cycle data measured in each of the plurality of actual ESSs; and a third method for predicting the ESS SOH using a multiplicative probability of each capacity range-dependent charging/discharging cycle data measured in each of the plurality of actual ESSs.

According to a second embodiment of the present invention, an energy storage system (ESS) state of health (SOH) prediction device includes: a plurality of actual Energy Storage Systems (ESSs); and an analysis unit for measuring and analyzing charging/discharging cycle data from each of the plurality of actual ESSs, wherein the analysis unit includes: a virtual capacity division unit for virtually dividing the capacity of the ESS to be measured into two or more capacity ranges; a reference voltage setting unit for setting a first reference voltage and a second reference voltage matching the divided capacitance range; and an ESS SOH prediction unit for predicting the SOH of the ESS from the inputted charging/discharging cycle data, wherein the number of the two or more capacity ranges divided by the virtual capacity division unit is equal to or less than the actual ESS number, and wherein the analysis unit transmits a first reference voltage and a second reference voltage matching the divided capacity range to the plurality of actual ESSs and repeats the charging or discharging process of each actual ESS to measure divided capacity range-dependent charging/discharging cycle data.

The virtual capacity division unit may set the virtually divided capacity range to overlap ranges adjacent to each other by a predetermined range, wherein the first reference voltage may correspond to an upper limit capacity of each divided capacity range, wherein the second reference voltage may correspond to a lower limit capacity of each divided capacity range, and wherein the first reference voltage may be higher than the second reference voltage.

Each of the plurality of actual ESSs may include a BSC for controlling charging/discharging of an actual ESS, wherein when the initial output voltage of the actual ESS is less than or equal to the first reference voltage, after charging is performed until the output voltage of the actual ESS becomes the first reference voltage, when the output voltage of the actual ESS exceeds the first reference voltage, the BSC may stop charging and perform discharging, wherein when the initial output voltage of the actual ESS is greater than or equal to the second reference voltage, after discharging is performed until the output voltage of the actual ESS becomes the second reference voltage, and when the output voltage of the actual ESS becomes less than the second reference voltage, the BSC may stop discharging and perform charging.

The ESS SOH prediction unit may predict an SOH of an ESS through at least one of: a first method for predicting the SOH of the ESS by summing each capacity range-dependent charging/discharging cycle data measured in each of the plurality of actual ESSs; a second method for predicting the ESS SOH by a combination sum of each capacity range-dependent charging/discharging cycle data measured in each of the plurality of actual ESSs; and a third method for predicting the ESS SOH using a multiplicative probability of each capacity range-dependent charging/discharging cycle data measured in each of the plurality of actual ESSs.

Advantageous Effects

The present invention may divide the capacity range of the ESS into several capacity ranges and rapidly collect charging/discharging cycle data of the ESSs for each capacity range.

In addition, by rapidly collecting the charging/discharging cycle data of the ESS for each capacity range, the SOH of the whole ESS may be predicted quickly.

MODE FOR CARRYING OUT THE INVENTION

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements when there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Method for Predicting SOH of ESS According to Embodiment of Present Invention.

In the conventional method of predicting the SOH of the ESS, the entire ESS capacity is charged or discharged at a time to obtain charging/discharging cycle data. When the charging/discharging cycle data for the whole is obtained by charging or discharging the total ESS capacity at once, since it takes a long time to charge or discharge the entire ESS, it is possible to obtain only four to five charging/discharging cycle data per day, so that It took a long time to obtain sufficient charging/discharging cycle data (more than 4000 times) and to predict the SOH of the ESS based on this data.

Figure 1:
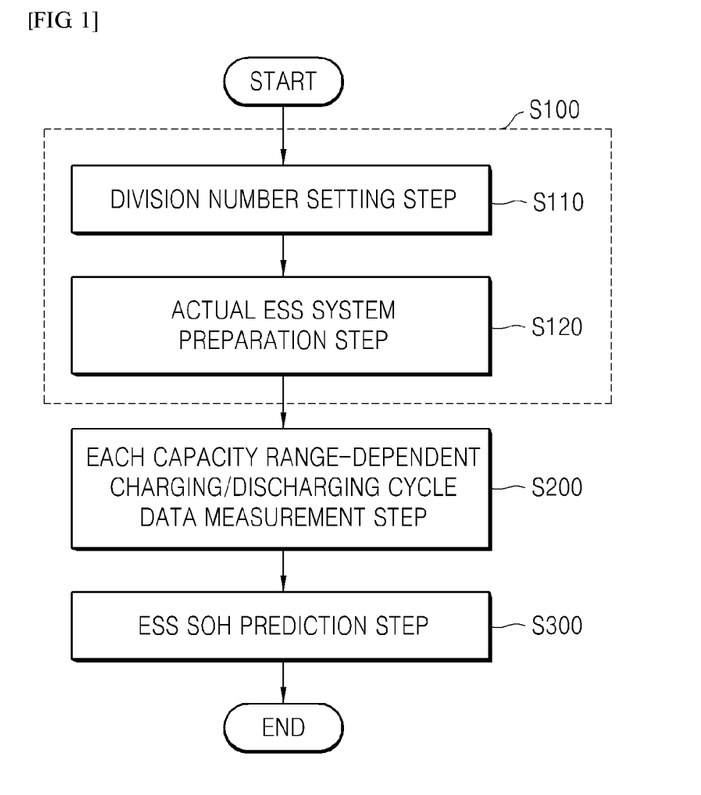
FIG. 1 is a flowchart according to an embodiment.

FIG. 1 is a flowchart illustrating a procedure of the present invention for solving the above-described problems.

Hereinafter, a method of rapidly predicting SOH of the ESS of the present invention will be described with reference to FIG. 1.

The present invention does not obtain a single charging/discharging cycle by charging or discharging the entire capacity of the ESS at a time, and divides the total capacity of the measurement target ESS virtually to obtain the charging/discharging cycle data for each divided capacity range thereby predicting the SOH of the whole ESS.

1-1. Capacity Virtual Division Step (S100)

The capacity virtual division step of the present invention is a step of virtually dividing the entire capacity of the measurement target ESS into two or more virtual capacities and may include a division number setting step of setting how many ranges the total capacity of the measurement target ESS is divided into.

1-1-1. Division Number Setting Step (S110)

The division number setting step is a step of setting how many ranges the entire measurement target ESS capacity should be virtually divided into.

For example, when the ESS total capacity is between 1 and 100, and when the ESS total capacity is divided into five ranges, each range may have a capacity range of 20.

1-1-2. Actual ESS Preparation Step (S120)

When the capacity of the measurement target ESS is divided into five ranges as described above, since charging/discharging cycle data must be collected while charging/discharging for each range, five actual ESSs (first to fifth actual ESSs) having the same specifications as the measurement target ESS are required.

In other words, in order to obtain charging/discharging cycle data of total capacity while charging/discharging each divided capacity range, an actual ESS corresponding to each of the capacity ranges divided in the division number setting step is required.

Meanwhile, the charging/discharging cycle data measured in the actual ESS may be capacity data of the actual ESS after charging/discharging is performed within the divided capacity range every time.

After charging/discharging is performed for each capacity divided from the capacity data measurement every time, a capacity retention rate indicating a ratio of how much the initial capacity is retained is calculated, and the SOH of the battery may be predicted from the capacity retention rate. For example, when the reference capacity retention rate determined as an aging or replacement state of the ESS is 10%, after 4,000 charging/discharging cycles, when the calculated capacity retention rate falls below the reference capacity retention rate, the SOH of the ESS may be estimated to be 4,000 charging/discharging. Here, the initial state capacity of each actual ESS is the initial state capacity of the division range divided by each capacity range.

In relation to the ESS, when charging/discharging is repeatedly performed, because of the characteristics of the battery constituting the ESS, the capacity of the ESS is slightly reduced. As the capacity of the ESS is gradually reduced in such a manner, there is a problem that other devices powered by the ESS may not be operated normally.

Therefore, based on the charging/discharging cycle data including the capacity retention rate, which is the result of comparing the capacity of the current ESS with the capacity in the initial state of the ESS, the SOH of the ESS is predicted, and this may be reflected in the operation of the ESS.

For example, when the SOH of the ESS is reduced to have only about 70% of the initial capacity, it may replace the ESS with a new ESS, or reduce the number of electronic connections powered by the ESS.

On the other hand, the actual ESS for each capacity range may be set so that the capacity range of the actual ESS matches the divided capacity range based on the output voltage of the actual ESS.

Figure 2:
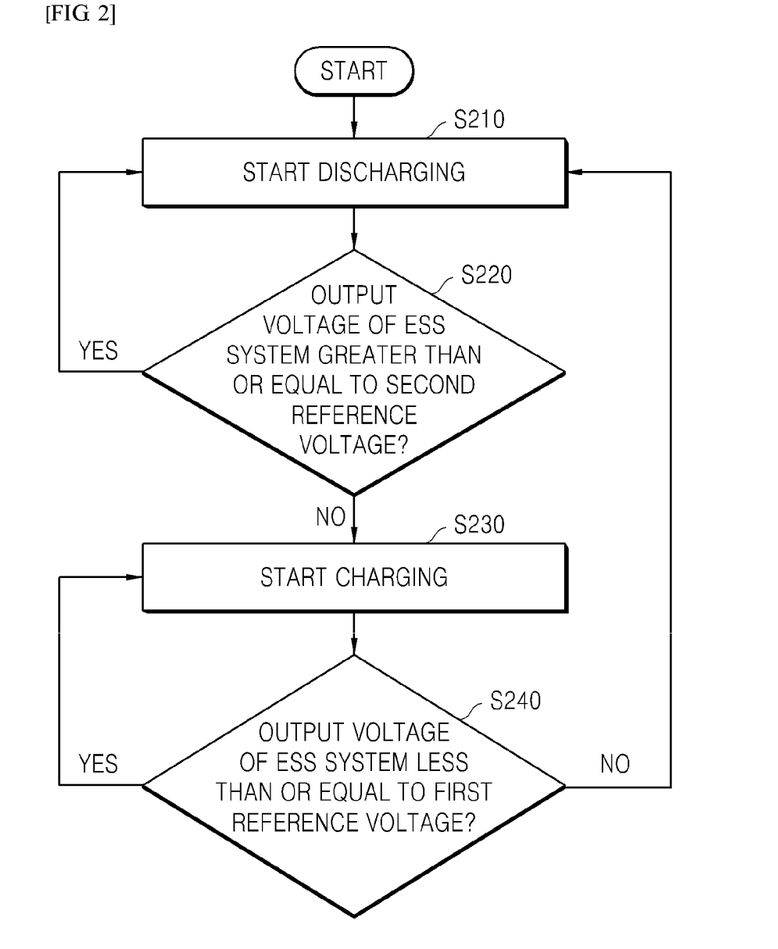
FIG. 2 is a flowchart illustrating a procedure for charging/discharging an ESS according to an embodiment of the present invention only within a set capacity range.

FIG. 2 is a flowchart illustrating a method of performing charging/discharging of an actual ESS within a range of 61 to 80 when an ESS having a total capacity range of 1 to 100 is divided into 5.

When the ESS with a total capacity range of 1 to 100 is divided into 5, an actual ESS that obtains charging/discharging cycle data in the range of 61 to 80 may be set to perform charging/discharging only between the first reference output voltage corresponding to the 80 capacity of the actual ESS and the second reference output voltage corresponding to the 61 capacity of the actual system.

More specifically, during discharging, as comparing the output voltage of the actual ESS with the second reference voltage, when the output voltage of the actual ESS is equal to or higher than the second reference voltage, discharging is subsequently performed, and when the output voltage of the actual ESS is less than the second reference output voltage, discharging is stopped and charging is performed. On the other hand, during charging, as comparing the output voltage of the actual ESS with the first reference voltage, when the output voltage of the actual ESS is less than the first reference voltage, charging is subsequently performed, and when the output voltage of the actual ESS exceeds the first reference output voltage, charging is stopped and discharging is performed.

As the above-described procedure, the actual ESS may perform charging/discharging only within the range of 61 to 80.

1-2. Each Range-Dependent Charging/Discharging Cycle Data Measurement Step (S200)

Each range-dependent charging/discharging cycle data measurement step of the present invention obtains charging/discharging cycle data while charging/discharging an actual ESS set for each of the capacity ranges.

In other words, the first actual ESS is set to perform charging/discharging only within a capacity range of 81 to 100 of the measurement target ESS and measures a capacity in each charging/discharging cycle for a capacity range of 81 to 100 while charging/discharging the first actual ESS. The second actual ESS is set to perform charging/discharging only within a capacity range of 61 to 80 of the measurement target ESS and measures a capacity in each charging/discharging cycle for a capacity range of 61 to 80 while charging/discharging the second actual ESS. The third actual ESS is set to perform charging/discharging only within a capacity range of 41 to 60 of the measurement target ESS and measures a capacity in each charging/discharging cycle for a capacity range of 41 to 60 while charging/discharging the third actual ESS. The fourth actual ESS is set to perform charging/discharging only within a capacity range of 21 to 40 of the measurement target ESS and measures the capacity in each charging/discharging cycle for a capacity range of 21 to 40 while charging/discharging the fourth actual ESS. The fifth actual ESS is set to perform charging/discharging only within a range of 1 to 20 of the measurement target ESS and measures the capacity in each charging/discharging cycle for the 1 to 20 capacity range while charging/discharging the fifth actual ESS.

For example, the second actual ESS sets a first reference voltage matching the upper limit capacitance 80 of the second actual ESS and a second reference voltage matching the lower limit capacitance 61 of the second actual ESS.

In the method of measuring the capacitance in each charging/discharging cycle of the second actual ESS, in which the first and second reference voltages are set, the first reference output voltage is compared with the output voltage of the second actual ESS (S240). When the output voltage of the second actual ESS is equal to or less than the first reference voltage, charging is performed continuously (S230). When the output voltage of the second actual ESS exceeds the first reference output voltage, charging is stopped and discharging is performed. As the second reference output voltage is compared with the output voltage of the second actual ESS (S220), when the output voltage of the second actual ESS is equal to or greater than the second reference output voltage, subsequently, discharging is performed (S210) and when the output voltage of the second actual ESS is less than the second reference output voltage, the discharging of the second actual ESS is stopped and charging is performed. Therefore, the second actual ESS may repeat the charging/discharging only within the range of 61 to 80 of the measurement target ESS to measure the capacity in each charging/discharging cycle of the second actual ESS.

Meanwhile, in the above example, it is described that the ranges for virtually dividing the measurement target ESS are not overlapped. However, the ranges for virtually dividing the measurement target ESS may be implemented to be partially overlapped.

In other words, the first actual ESS may be set to have a capacity range of 76 to 100, the second actual ESS may be set to have a capacity range of 56 to 80, the third actual ESS may be set to have a dosage range of 36 to 60, the fourth actual ESS may be set to have a capacity range of 16 to 40, and the fifth actual ESS may be set to have a capacity range of 1 to 25. At this time, a capacity measurement method in a capacity range of the first to fifth actual ESSs and each charging/discharging cycle may be performed in the same manner as the method of setting the capacity range of the first to fifth actual ESSs when the range for virtually dividing the measurement target ESS is not overlapped and the capacity measurement method in each charging/discharging cycle.

Figure 3:
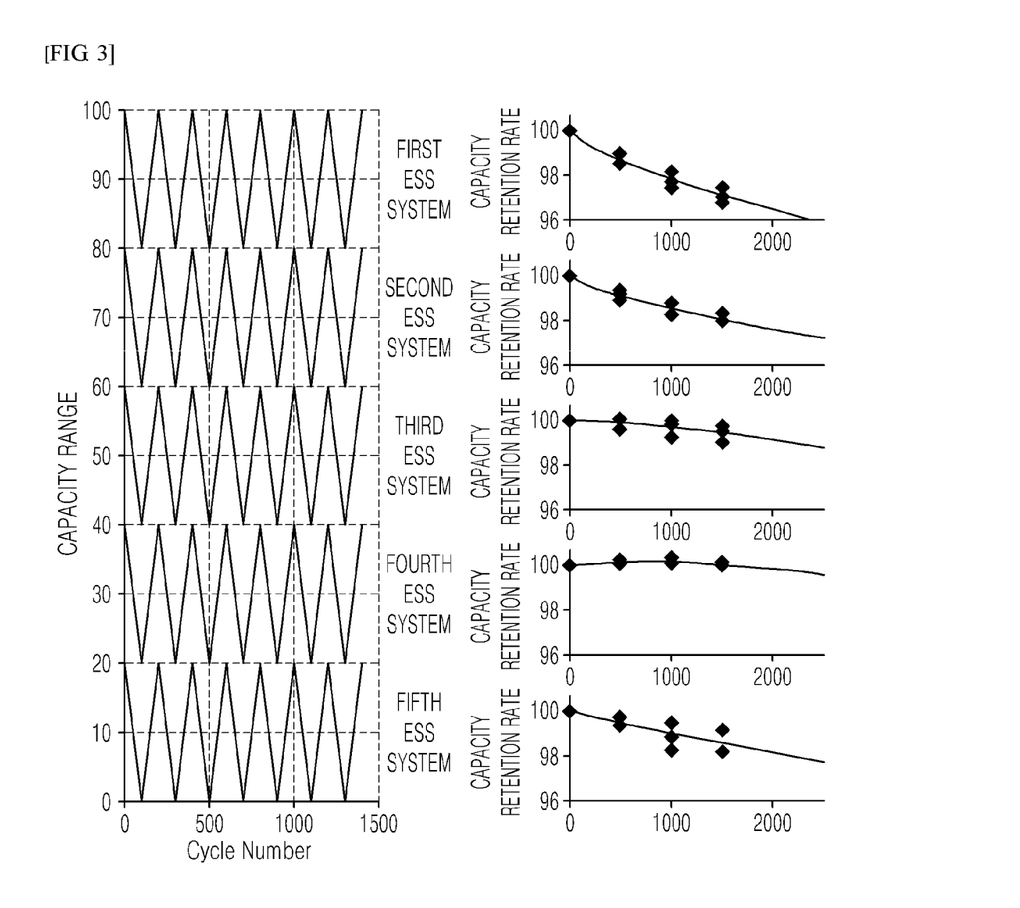
FIG. 3 shows the result of measuring each charging/discharging cycle by dividing each of the first to fifth actual ESSs according to the embodiment of the present invention into five ranges.

When the divided ranges are designed to partially overlap with each other, by covering the error caused by the reduction in the use area of the cathode in the degradation of a particular section (for example, SOC 60 to 40 section) is greater than that of the other section in the section-dependent degradation of the ESS, it is possible to reduce occurring errors. FIG. 3 is a result of measuring charging/discharging cycle data of each of the first to fifth actual ESSs corresponding to the divided capacity ranges according to the embodiment of the present invention.

Referring to FIG. 3, the graph on the left is a graph showing that the first to fifth actual ESSs are charged/discharged by dividing the measurement target ESS by each range, and the five graphs shown on the right are graphs showing the capacity retention rates measured in the first to fifth actual ESSs.

Referring to the five graphs on the right side of FIG. 3, it may be seen that there is a difference in the capacity retention rate when charging/discharging is repeated in each range. As the capacity retention rate differs for each range in such a manner, the capacity in the charging/discharging cycle is measured only a part of the measurement target ESS capacity range, and based on this, when estimating the total SOH of the measurement target ESS, a large error occurs.

Accordingly, in the present invention, without measuring the capacity in a charging/discharging cycle for only a certain period, the capacity ranges of the first to fifth actual ESSs are set to include the capacity of the measurement target ESS, thereby measuring the capacity in the charging/discharging cycle throughout the capacity range of the measurement target ESS.

Meanwhile, in the ESS SOH prediction step described later, based on the capacity in the charging/discharging cycle measured in the entire capacity range of the first through fifth actual ESSs set as described above, the total SOH of the battery may be predicted.

1-3. Measurement Target ESS SOH Prediction Step (S300)

The ESS SOH prediction step of the present invention predicts the SOH of the measurement target ESS based on the charging/discharging cycle data measured in each of the plurality of actual ESSs set for each divided capacity range.

Meanwhile, in the present invention, the measurement target ESS SOH is predicted through three methods based on the charging/discharging cycle data measured in the actual ESS set for each divided capacity range.

First, the charging/discharging cycle data measured in each of the plurality of actual ESSs set in the respective capacity ranges may be simply summed to predict the SOH of the measurement target of the ESS.

Second, the combination sum of the charging/discharging cycle data measured in each of the plurality of actual ESSs set in the respective capacity ranges may be calculated to predict the SOH of the measurement target ESS.

Lastly, with the multiplicative probability of the charging/discharging cycle data measured in each of the plurality of actual ESSs set in the respective capacity ranges, the SOH of the measurement target ESS may be predicted.

Figure 4:
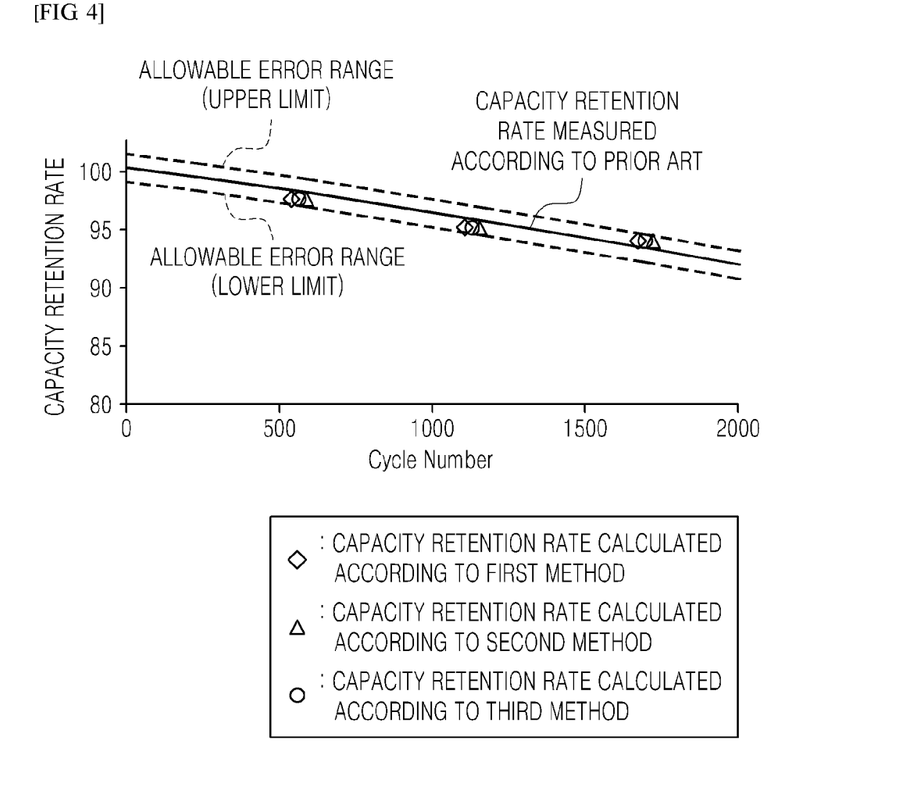
FIG. 4 is a graph comparing the result of predicting the SOH of the measurement target ESS according to the procedure of the embodiment of the present invention and the result of predicting the SOH of the measurement target ESS according to the prior art.

Meanwhile, FIG. 4 is a graph in which the charging/discharging range of a plurality of actual ESSs (first to fifth ESSs) is set to correspond to each divided capacity range according to the procedure of the embodiment of the present invention and the result of the prediction of the SOH of the measurement target ESS through the above three methods based on actual ESS charging/discharging data corresponding to each capacity range is compared with the SOH (prior art) of the measurement target ESS that is predicted while charging/discharging the measurement target ESS at a time. Referring to FIG. 4, it may be seen that it is within the error range of the SOH (prior art) of the measurement target ESS predicted while charging/discharging the measurement target ESS at once and the result of prediction of the SOH of the measurement target ESS predicted according to the procedure of the present invention.

Meanwhile, when using the method of the present invention, the time taken to obtain the charging/discharging cycle data for the total capacity of the measurement target ESS is further reduced as the division number of dividing the total capacity of the ESS increases.

Therefore, by using the above-described method of the present invention, the SOH of the entire ESS may be measured quickly while satisfying the reliability.

2. ESS SOH Prediction Device According to First Embodiment of Present Invention

Figure 5:
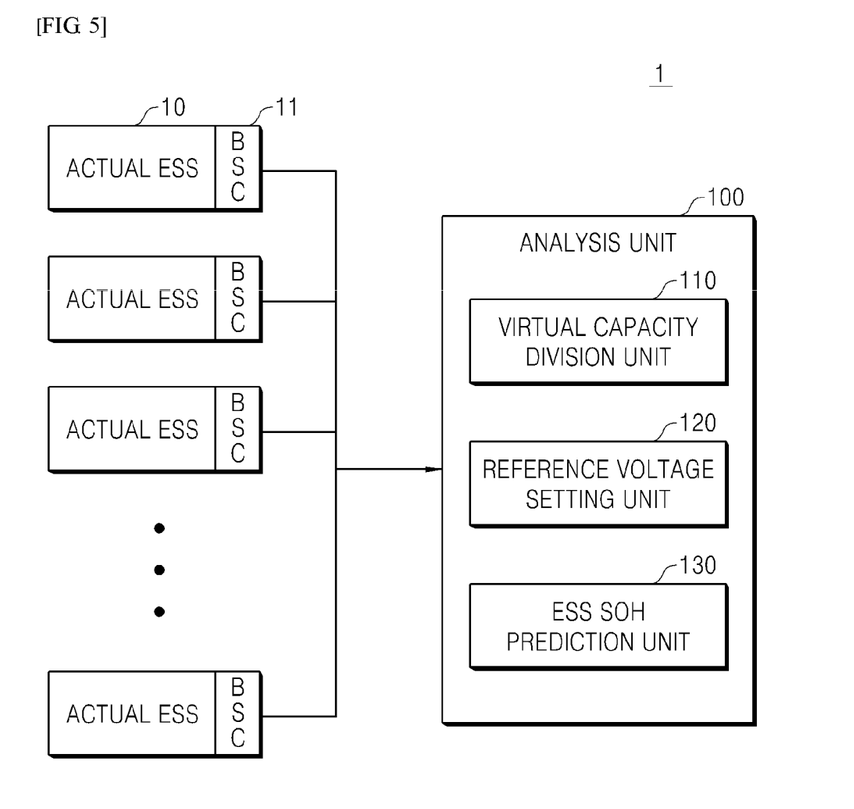
FIG. 5 is a diagram illustrating an ESS SOH prediction device according to an embodiment of the present invention.

FIG. 5 is a view illustrating an ESS SOH prediction device 1 according to a first embodiment of the present invention.

The ESS SOH prediction device 1 according to the first embodiment of the present invention may be configured including a plurality of actual Energy Storage Systems (ESSs) 10, and an analysis unit 100 for analyzing charging/discharging cycle data measured from each of the plurality of actual ESSs 10.

Meanwhile, it is preferable that the number of the actual ESSs 10 is equal to or greater than the number of capacity ranges divided by the virtual capacity division unit 120 described later.

In other words, in the ESS SOH prediction device according to the first embodiment of the present invention, depending on the number of capacity ranges in the virtual capacity division unit, the number of actual ESSs performing charging/discharging may be determined.

Meanwhile, the analysis unit 100 may be configured including a virtual capacity division unit 110 for virtually dividing the capacity of the ESS to be measured into two or more capacity ranges, a reference voltage setting unit 120 for setting a first reference voltage and a second reference voltage matched to the divided capacitance range, and an ESS SOH prediction unit 130 for predicting the SOH of the ESS from the input charging/discharging cycle data.

Then, the analysis unit 100 may repeat a charging or discharging process of each actual ESS 10 to measure charging/discharging cycle data for each divided capacity range after a first reference voltage and a second reference voltage matched to the divided capacitance range are transmitted to each of the plurality of actual ESSs.

Meanwhile, the virtual capacity division unit 110 may set virtually divided capacity ranges to overlap with each other by a predetermined range.

The first reference voltage is a value corresponding to an upper limit capacity of each divided capacity range, and the second reference voltage is a value corresponding to a lower limit capacity of each divided capacity range. The first reference voltage is greater than the second reference voltage.

Each of the plurality of actual ESSs 10 may be configured to include a BSC 11 for controlling charging/discharging of the actual ESS 10.

Specifically, when the initial output voltage of the actual ESS is less than or equal to the first reference voltage, after the charging is performed until the output voltage of the actual ESS becomes the first reference voltage, when the output voltage of the actual ESS exceeds the first reference voltage, the BSC stops charging and performs discharging, and when the initial output voltage of the actual ESS is greater than or equal to the second reference voltage, after discharging is performed until the output voltage of the actual ESS becomes the second reference voltage, when the output voltage of the actual ESS becomes less than the second reference voltage, the BSC may control the actual ESS 10 to stop discharging and perform charging.

For example, when the initial output voltage exceeds the first reference voltage, the plurality of actual ESSs 10 are discharged until a second reference voltage is obtained, and then charged until a first reference voltage is obtained. Thereafter, the plurality of actual ESSs 10 may measure the charging/discharging cycle data by continuously repeating the discharging process until reaching the second reference voltage. In other words, the BSC 11 may charge each actual ESS to a charge upper limit capacity within a capacity range allocated to each actual ESS, and may control the actual ESS to repeat the process of discharging to the charge lower limit capacity.

Meanwhile, the BSC 11 may transmit charging/discharging cycle data to the ESS SOH prediction unit.

Meanwhile, the ESS SOH prediction unit 130 may predict the SOH of the ESS through at least one of a first method for estimating the SOH of the ESS by simply summing the charging/discharging cycle data for each capacity range measured in each of the plurality of actual ESSs, a second method for predicting ESS SOH by summing up charging/discharging cycle data for each capacity range measured in each of the plurality of actual ESSs, and a third method for estimating ESS SOH using a multiplicative probability of charging/discharging cycle data for each capacity range measured in each of the plurality of actual ESSs.

3. ESS SOH Prediction Device According to Second Embodiment of Present Invention The ESS SOH prediction device 2 according to the first embodiment of the present invention may be configured including a plurality of actual Energy Storage Systems (ESSs) 10, and an analysis unit 100 for analyzing charging/discharging cycle data measured from each of the plurality of actual ESSs 10.

Meanwhile, the analysis unit 100 may be configured including a virtual capacity division unit 110 for virtually dividing the capacity of the ESS to be measured into two or more capacity ranges, a reference voltage setting unit 120 for setting a first reference voltage and a second reference voltage matched to the divided capacitance range, and an ESS SOH prediction unit 130 for predicting the SOH of the ESS from the input charging/discharging cycle data.

Then, the analysis unit 100 may repeat a charging or discharging process of each actual ESS 10 to measure charging/discharging cycle data for each divided capacity range after a first reference voltage and a second reference voltage matched to the divided capacitance range are transmitted to each of the plurality of actual ESSs.

Meanwhile, it is preferable that the number of capacity ranges divided by the virtual capacity division unit 110 is equal to or less than the number of actual ESSs.

In other words, since the number of actual ESSs is limited, in order to actually charge/discharge the actual ESS by allocating each capacity range to actual ESS, the number of divided capacity ranges may not exceed the number of actual ESSs.

Meanwhile, it is most preferable that the capacity range divided by the virtual capacity division unit 110 and allocated to each actual ESS is the same as the number of the actual ESSs.

For example, when the capacity range divided by the virtual capacity division unit 110 is equal to the actual ESS number, based on Equation 1 below, the capacity range of each actual ESS may be calculated.

$$ESSk\_SOC=\{(k-1)/N\}*100+1\sim(k/N)*100 \quad \text{(Equation 1)}$$

(where k=1, 2, . . . , N; N is a divisor of 100 excluding 1 and 100)

Meanwhile, the virtual capacity division unit 110 may set virtually divided capacity ranges to overlap with each other by a predetermined range.

The first reference voltage is a value corresponding to an upper limit capacity of each divided capacity range, and the second reference voltage is a value corresponding to a lower limit capacity of each divided capacity range. The first reference voltage is greater than the second reference voltage.

On the other hand, each of the plurality of actual ESSs 10 may be configured to include a BSC 11 for controlling charging/discharging of the actual ESS 10.

Specifically, when the initial output voltage of the actual ESS is less than or equal to the first reference voltage, after the charging is performed until the output voltage of the actual ESS becomes the first reference voltage, when the output voltage of the actual ESS exceeds the first reference voltage, the BSC stops charging and performs discharging, and when the initial output voltage of the actual ESS is greater than or equal to the second reference voltage, after discharging is performed until the output voltage of the actual ESS becomes the second reference voltage, when the output voltage of the actual ESS becomes less than the second reference voltage, the BSC may control the actual ESS 10 to stop discharging and perform charging.

For example, when the initial output voltage exceeds the first reference voltage, the plurality of actual ESSs 10 are discharged until a second reference voltage is obtained, and then charged until a first reference voltage is obtained. Thereafter, the plurality of actual ESSs 10 may measure the charging/discharging cycle data by continuously repeating the discharging process until reaching the second reference voltage. In other words, the BSC 11 may charge each actual ESS to a charge upper limit capacity within a capacity range allocated to each actual ESS, and may control the actual ESS to repeat the process of discharging to the charge lower limit capacity.

Meanwhile, the BSC 11 may transmit charging/discharging cycle data to the ESS SOH prediction unit.

Meanwhile, the ESS SOH prediction unit 130 may predict the SOH of the ESS through at least one of a first method for estimating the SOH of the ESS by simply summing the charging/discharging cycle data for each capacity range measured in each of the plurality of actual ESSs, a second method for predicting ESS SOH by summing up charging/discharging cycle data for each capacity range measured in each of the plurality of actual ESSs, and a third method for estimating ESS SOH using a multiplicative probability of charging/discharging cycle data for each capacity range measured in each of the plurality of actual ESSs.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. An energy storage system (ESS) state of health (SOH) prediction method comprising:
   a capacity virtual division step of virtually dividing a capacity of a measurement target ESS into two or more capacity ranges;
   each capacity range-dependent charging/discharging cycle data measurement step of measuring charging/discharging cycle data of each capacity range divided in the capacity virtual division step; and
   a measurement target ESS SOH prediction step of predicting an SOH of the measurement target ESS based on charging/discharging cycle data in the each capacity range-dependent charging/discharging cycle data measurement step.

2. The method of claim 1, wherein the capacity virtual division step comprises:
   a division range number setting step of setting a number of ranges a total capacity of the measurement target ESS is divided; and
   an actual ESS preparation step of preparing an actual ESS for each capacity range of the measurement target ESS, wherein a range of e actual ESS is set based on an output voltage to match the divided range, and wherein the divided range of the actual ESS is overlapped with ranges adjacent to each other by a predetermined range.

3. The method of claim 2, wherein the each capacity range-dependent charging/discharging cycle data measurement step repeats the charging/discharging of the actual ESS corresponding to each capacity range divided in the capacity virtual division step to measure charging/discharging cycle data of the actual ESS corresponding to the each capacity range.

4. The method of claim 3, wherein the method of the repeating charging/discharging of the actual ESS comprises:
a first reference voltage setting step of setting a first reference voltage matching an upper limit capacity in each capacity range corresponding to the actual ESS;
a second reference voltage setting step of setting a second reference voltage matching a lower limit capacity in each capacity range corresponding to the actual ESS;
an output voltage measurement step of measuring an output voltage of the actual ESS;
a comparison step of comparing the measured output voltage of the actual ESS with the first and second reference voltages; and
a charging/discharging determination step of determining charging or discharging of the actual ESS according to a comparison result of the comparison step.

5. The method of claim 4, wherein the charging/discharging determination step includes performing charging when the output voltage of the actual ESS is less than or equal to the first reference voltage according to the comparison result of the comparison step and stopping charging and performing discharging when the output voltage of the actual ESS exceeds the first reference voltage.

6. The method of claim 4, wherein the charging/discharging determination step includes performing discharging when the output voltage of the actual ESS is greater than or equal to the second reference voltage according to the comparison result of the comparison step and stopping discharging and performing charging when the output voltage of the actual ESS is less than the second reference voltage.

7. The method of claim 1, wherein the ESS SOH prediction step predicts an SOH of an ESS through at least one of:
a first method for predicting the SOH of the ESS by summing each capacity range-dependent charging/discharging cycle data measured in the each capacity range-dependent charging/discharging cycle data measurement step;
a second method for predicting the ESS SOH by a combination sum of each capacity range-dependent charging/discharging cycle data measured in the each capacity range-dependent charging/discharging cycle data measurement step; and
a third method for predicting the ESS SOH using a multiplicative probability of each capacity range-dependent charging/discharging cycle data measured in the each capacity range-dependent charging/discharging cycle data measurement step.

8. An energy storage system (ESS) state of health (SOH) prediction device comprising:
a plurality of actual energy storage systems (ESSs); and
an analysis unit for measuring and analyzing charging/discharging cycle data from each of the plurality of actual ESSs,
wherein the analysis unit comprises:
a virtual capacity division unit for virtually dividing a capacity of the ESS to be measured into two or more capacity ranges;
a reference voltage setting unit for setting a first reference voltage and a second reference voltage matching the divided capacitance range; and
an ESS SOH prediction unit for predicting the SOH of the ESS from the inputted charging/discharging cycle data,
wherein the number of actual ESSs is equal to or greater than the number of capacity ranges divided by the virtual capacity division unit, and
wherein the analysis unit transmits a first reference voltage and a second reference voltage matching the divided capacity range to the plurality of actual ESSs and repeats the charging or discharging process of each actual ESS to measure divided capacity range-dependent charging/discharging cycle data.

9. The device of claim 8, wherein the virtual capacity division unit sets the virtually divided capacity range to overlap ranges adjacent to each other by a predetermined range,
wherein the first reference voltage corresponds to an upper limit capacity of each divided capacity range,
wherein the second reference voltage corresponds to a lower limit capacity of each divided capacity range, and
wherein the first reference voltage is higher than the second reference voltage.

10. The device of claim 8, wherein each of the plurality of actual ESSs comprises a BSC for controlling charging/discharging of an actual ESS,
wherein when the initial output voltage of the actual ESS is less than or equal to the first reference voltage, after charging is performed until the output voltage of the actual ESS becomes the first reference voltage, when the output voltage of the actual ESS exceeds the first reference voltage, the BSC stops charging and performs discharging, and
wherein when the initial output voltage of the actual ESS is greater than or equal to the second reference voltage, after discharging is performed until the output voltage of the actual ESS becomes the second reference voltage, and when the output voltage of the actual ESS becomes less than the second reference voltage, the BSC stops discharging and performs charging.

11. The device of claim 8, wherein the ESS SOH prediction unit predicts an SOH of an ESS through at least one of:
a first method for predicting the SOH of the ESS by summing each capacity range-dependent charging/discharging cycle data measured in each of the plurality of actual ESSs;
a second method for predicting the ESS SOH by a combination sum of each capacity range-dependent charging/discharging cycle data measured in each of the plurality of actual ESSs; and
a third method for predicting the ESS SOH using a multiplicative probability of each capacity range-dependent charging/discharging cycle data measured in each of the plurality of actual ESSs.

12. An energy storage system (ESS) state of health (SOH) prediction device comprising:
a plurality of actual energy storage systems (ESSs); and
an analysis unit for measuring and analyzing charging/discharging cycle data from each of the plurality of actual ESSs, wherein the analysis unit comprises:
a virtual capacity division unit for virtually dividing the capacity of the ESS to be measured into two or more capacity ranges;
a reference voltage setting unit for setting a first reference voltage and a second reference voltage matching the divided capacitance range; and
an ESS SOH prediction unit for predicting the SOH of the ESS from the inputted charging/discharging cycle data,
wherein the number of the two or more capacity ranges divided by the virtual capacity division unit is equal to or less than the actual ESS number, and
wherein the analysis unit transmits a first reference voltage and a second reference voltage matching the divided capacity range to the plurality of actual ESSs and repeats the charging or discharging process of each actual ESS to measure divided capacity range-dependent charging/discharging cycle data.

13. The device of claim 12, wherein the virtual capacity division unit sets the virtually divided capacity range to overlap ranges adjacent to each other by a predetermined range,
wherein the first reference voltage corresponds to an upper limit capacity of each divided capacity range,
wherein the second reference voltage corresponds to a lower limit capacity of each divided capacity range, and
wherein the first reference voltage is higher than the second reference voltage.

14. The device of claim 12, wherein each of the plurality of actual ESSs comprises a BSC for controlling charging/discharging of an actual ESS,
wherein when the initial output voltage of the actual ESS is less than or equal to the first reference voltage, after charging is performed until the output voltage of the actual ESS becomes the first reference voltage, and when the output voltage of the actual ESS exceeds the first reference voltage, the BSC stops charging and performs discharging, and
wherein when the initial output voltage of the actual ESS is greater than or equal to the second reference voltage, after discharging is performed until the output voltage of the actual ESS becomes the second reference voltage, and when the output voltage of the actual ESS becomes less than the second reference voltage, the BSC stops discharging and performs charging.

15. The device of claim 12, wherein the ESS SOH prediction unit predicts an SOH of an ESS through at least one of:
a first method for predicting the SOH of the ESS by summing each capacity range-dependent charging/discharging cycle data measured in each of the plurality of actual ESSs;
a second method for predicting the ESS SOH by a combination sum of each capacity range-dependent charging/discharging cycle data measured in each of the plurality of actual ESSs; and
a third method for predicting the ESS SOH using a multiplicative probability of each capacity range-dependent charging/discharging cycle data measured in each of the plurality of actual ESSs.

* * * * *